United States Patent
Sanghani et al.

(10) Patent No.: US 8,943,457 B2
(45) Date of Patent: Jan. 27, 2015

(54) SIMULATING SCAN TESTS WITH REDUCED RESOURCES

(75) Inventors: Amit Dinesh Sanghani, Santa Clara, CA (US); Punit Kishore, Bangalore (IN)

(73) Assignee: NVIDIA Corporation, Santa Clara, CA (US)

(*) Notice: Subject to any disclaimer, the term of this patent is extended or adjusted under 35 U.S.C. 154(b) by 533 days.

(21) Appl. No.: 12/277,285

(22) Filed: Nov. 24, 2008

(65) Prior Publication Data
US 2010/0131910 A1    May 27, 2010

(51) Int. Cl.
G06F 17/50    (2006.01)
G01R 31/3185    (2006.01)

(52) U.S. Cl.
CPC .............. G01R 31/318583 (2013.01)
USPC ........... 716/136; 716/103; 716/106; 716/107; 716/110; 716/111; 716/138; 714/718; 714/722; 714/724; 714/726; 714/729; 714/733; 714/734

(58) Field of Classification Search
USPC ......... 714/718, 722, 724–726, 729, 733–734; 716/100–101, 103, 106–107, 110–111, 716/136, 138
See application file for complete search history.

(56) References Cited

U.S. PATENT DOCUMENTS

| | | | |
|---|---|---|---|
| 2,795,755 A | 6/1957 | Antfies | |
| 3,870,953 A | 3/1975 | Boatman et al. | |
| 4,700,293 A | 10/1987 | Grone | |
| 5,247,689 A | 9/1993 | Ewert | |
| 5,257,223 A | 10/1993 | Dervisoglu | |
| 5,258,648 A | 11/1993 | Lin | |
| 5,262,719 A | 11/1993 | Magdo | |
| 5,409,568 A | 4/1995 | Vasche | |
| 5,428,622 A | 6/1995 | Kuban et al. | |
| 5,499,248 A | 3/1996 | Behrens et al. | |
| 5,579,510 A | 11/1996 | Wang et al. | |
| 5,635,718 A | 6/1997 | DePuydt et al. | |
| 5,807,763 A | 9/1998 | Motika et al. | |
| 5,818,252 A | 10/1998 | Fullman et al. | |

(Continued)

FOREIGN PATENT DOCUMENTS

DE    19515591    10/1995

OTHER PUBLICATIONS

"S. Gerstendorfer and H.J. Wunderlich," Minimized Power Consumption for Scan-Based Bist, International Test Conference, Date: Sep. 1999, pp. 77-84.

(Continued)

*Primary Examiner* — Nghia Doan

(57) ABSTRACT

An aspect of the present invention replaces memory elements in a scan chain with corresponding new (memory) elements, with each new element having two paths to provide the corresponding data output. One of the two paths is operable to connect the data value to the combinational logic only during a capture phase of said test mode, and the second path is operable to connect the data value to the next element in the chain during a shift phase of said test mode. As a result, unneeded transitions/evaluations in the combinational logic are avoided during shift time, thereby reducing the resource requirements in the corresponding duration. However, the further processes (including various design phases and fabrication) are continued based on the original data (i.e., without the new elements) such that unneeded delays are avoided during the eventual operation in functional mode of the various fabricated IC units.

17 Claims, 5 Drawing Sheets

(56) References Cited

U.S. PATENT DOCUMENTS

| | | | |
|---|---|---|---|
| 5,834,844 A | 11/1998 | Akagawa et al. | |
| 5,880,592 A | 3/1999 | Sharpes et al. | |
| 5,907,562 A | 5/1999 | Wrape et al. | |
| 5,913,034 A | 6/1999 | Malcolm | |
| 5,930,269 A | 7/1999 | Tsukamoto et al. | |
| 5,946,372 A | 8/1999 | Jones et al. | |
| 5,966,021 A | 10/1999 | Eliashberg et al. | |
| 5,996,099 A | 11/1999 | Fournel et al. | |
| 6,011,748 A | 1/2000 | Lepejian et al. | |
| 6,049,900 A | 4/2000 | Fournel et al. | |
| 6,055,619 A | 4/2000 | North et al. | |
| 6,056,784 A | 5/2000 | Stanion | |
| 6,057,698 A | 5/2000 | Heo et al. | |
| 6,081,429 A | 6/2000 | Barrett | |
| 6,085,346 A | 7/2000 | Lepejian et al. | |
| 6,097,087 A | 8/2000 | Farnworth et al. | |
| 6,114,892 A | 9/2000 | Jin | |
| 6,133,744 A | 10/2000 | Yojima et al. | |
| 6,246,252 B1 | 6/2001 | Malladi et al. | |
| 6,247,165 B1 | 6/2001 | Wohl et al. | |
| 6,297,654 B1 | 10/2001 | Barabi | |
| 6,307,162 B1 | 10/2001 | Masters et al. | |
| 6,336,212 B1 | 1/2002 | Gray et al. | |
| 6,380,555 B1 | 4/2002 | Hembree et al. | |
| 6,392,432 B1 | 5/2002 | Jaimsomporn et al. | |
| 6,420,888 B1 | 7/2002 | Griffin et al. | |
| 6,429,532 B1 | 8/2002 | Han et al. | |
| 6,472,895 B2 | 10/2002 | Jaimsomporn et al. | |
| 6,472,900 B1 | 10/2002 | Malladi et al. | |
| 6,519,729 B1 | 2/2003 | Whetsel | |
| 6,534,853 B2 | 3/2003 | Liu et al. | |
| 6,590,294 B1 | 7/2003 | Lee et al. | |
| 6,622,273 B1 | 9/2003 | Barnes | |
| 6,625,784 B1 | 9/2003 | Ohta et al. | |
| 6,686,615 B1 | 2/2004 | Cheng et al. | |
| 6,750,646 B1 | 6/2004 | Voss et al. | |
| 6,763,488 B2 | 7/2004 | Whetsel | |
| 6,769,080 B2 | 7/2004 | Whetsel | |
| 6,788,105 B2 | 9/2004 | Kono | |
| 6,873,927 B2 | 3/2005 | Chi et al. | |
| 6,876,215 B1 | 4/2005 | Hannan et al. | |
| 6,878,172 B2 | 4/2005 | Jensen | |
| 6,884,642 B2 | 4/2005 | Farnworth et al. | |
| 6,914,424 B2 | 7/2005 | Chi et al. | |
| 6,915,468 B2 | 7/2005 | Chambers et al. | |
| 6,933,524 B2 | 8/2005 | Hembree et al. | |
| 6,990,642 B2* | 1/2006 | Arakawa | 716/103 |
| 7,020,699 B2 | 3/2006 | Zhang et al. | |
| 7,051,257 B2 | 5/2006 | Whetsel | |
| 7,216,050 B1 | 5/2007 | Bachman et al. | |
| 7,279,887 B1 | 10/2007 | King et al. | |
| 7,428,715 B2 | 9/2008 | Fournier et al. | |
| 7,444,569 B2* | 10/2008 | Shidei | 714/729 |
| 7,523,369 B2 | 4/2009 | Chang | |
| 7,568,142 B2 | 7/2009 | Whetsel | |
| 7,636,871 B1 | 12/2009 | Blue et al. | |
| 7,761,751 B1 | 7/2010 | West | |
| 7,765,443 B1 | 7/2010 | Syed et al. | |
| 7,842,948 B2 | 11/2010 | Schieck et al. | |
| 7,919,981 B2* | 4/2011 | Irie | 326/46 |
| 8,271,252 B2 | 9/2012 | Chatterjee et al. | |
| 8,368,416 B2 | 2/2013 | King | |
| 8,510,616 B2 | 8/2013 | Singhal | |
| 8,745,200 B2 | 6/2014 | Mali | |
| 2001/0006233 A1 | 7/2001 | Vallett | |
| 2001/0010356 A1 | 8/2001 | Talbot et al. | |
| 2002/0016952 A1 | 2/2002 | Chang et al. | |
| 2003/0018945 A1 | 1/2003 | Foster et al. | |
| 2003/0023912 A1 | 1/2003 | Lesea | |
| 2003/0101395 A1 | 5/2003 | Man et al. | |
| 2003/0119297 A1 | 6/2003 | Lam et al. | |
| 2003/0120829 A1 | 6/2003 | Avvari et al. | |
| 2003/0124816 A1 | 7/2003 | Potts | |
| 2003/0131717 A1 | 7/2003 | Shiiya | |
| 2004/0015762 A1 | 1/2004 | Klotz et al. | |
| 2005/0055617 A1 | 3/2005 | Wang et al. | |
| 2005/0166110 A1 | 7/2005 | Swanson et al. | |
| 2005/0229058 A1 | 10/2005 | Shidei | |
| 2007/0016834 A1* | 1/2007 | Debnath et al. | 714/726 |
| 2008/0021669 A1 | 1/2008 | Blancha et al. | |
| 2008/0092002 A1* | 4/2008 | Shimooka | 714/731 |
| 2008/0115005 A1 | 5/2008 | Kamada | |
| 2008/0122463 A1 | 5/2008 | Dabral et al. | |
| 2008/0222205 A1 | 9/2008 | Lange | |

OTHER PUBLICATIONS

Chatterjee, Prosenjit, Article entitled: "Streamline Verification Process With Formal Property Verification to Meet Highly Compressed Design Cycle", pp. 674-677, Jun. 17, 2005.

D. Heidel et al., "High Speed Serializing/De-Serializing Design for Test Method for Evaluating a 1Ghz Microprocessor", Proceedings VLSI Test Symposium, Date: IEEE 1998, pp. 234-238.

Harald Varnken, Tom Waayers, Nerve Fleury and David Lelouvier, "Enhanced Reduced Pincount Testin for Full-Scan Design", Proceedings of the 2001 International Test Conference, Date: 2001, pp. 738-747.

Ko et al., "A Novel Automated Scan Chain Division Method for Shift and Capture Power Reduction in Broadside At-Speed Test", Quality Electronic Design, 2008 ISQED 2008. 9th International Symposium Quality Electronic Design, pp. 649-654.

Nicolici et al., "Multiple Scan Chains for Poer Minimization During Test Application in Sequestial Circuits", IEEE Transactions on Computers, vol. 51, No. 6, pp. 721-734, Jun. 2002.

R.M. Chou, K.K. Saluja and V.D. Agrawal, "Scheduling Test for VLSI Systems Under Power Constraints", IEEE Transactions on Very Large Scale Integration Systems, Date: Jun. 1997, pp. 175-185, vol. 5, No. 2.

Ranganathan Sankaralingam, B. Pouya, and Nur A. Touba, "Reducing Test Power During Test Using Programmable Scan Chain Disable" 19th IEEE Proceedings of the VLSI Test Symposium, Date: Apr. 2001, pp. 319-324.

Rosinger et al., "Scan Architecture with Manually Exclusive Scan Segment Activation for Shift and Capture Power Reduction" IEEE Trans. On Computer Aided Design of Integrated Circuits and systems, vol. 23, No. 7, 019.1142-1153, Jul. 2004.

S. Chakravarthy and V.P. Dabholkar, "Two Techniques for Minimizing Power Dissipation in Scan Circuts During Test Application", Proceedings of the third Asian Test Symposium, Date: Nov. 1994, pp. 324-329.

S. Wang and S.K. Gupta, "LT-RTPG: A New Test-Per-Scan Bist TPG for Low Heat Dissipation", International Test Conference, Date: Sep. 1999, pp. 85-94.

Saxena. J, Butler Kenneth M and Whetsel Lee, "An Analysis O Power Reduction Techniques in Scan Testing", Proceedings of International Test Conference, 2001, Date: Oct. 2001, pp. 670-677.

V.P. Dabholkar, S. Chakravarthy, I.Pomeranz and S. Reddy, "Techniques for Minimizing Power Dissipation in Scan and Combinational Circuits During Test Application", IEEE Transaction on Computer-Aided Design of Integrated Circuits and Systems, Date: Dec. 1998, pp. 1325-1333, vol. 17, Issue 12.

Y.Zorian, "Testing the Monster Chip" IEEE Spectrum, Date: Jul. 1999, pp. 1119-1122.

* cited by examiner

SIMULATING SCAN TESTS WITH REDUCED RESOURCES

BACKGROUND OF THE INVENTION

1. Technical Field

The present disclosure relates to computer aided design of integrated circuits (IC), and more specifically to simulating scan tests with reduced resources.

2. Related Art

Simulation is often performed during the design of an integrated circuit (IC). Simulation entails ensuring that a logical design of the IC, represented as data, performs its intended functions. Typically a simulation tool is used to provide various inputs to the circuit representation and various parameters/values are observed for compliance with the desired results/behavior.

There is a general need to simulate scan tests during design of ICs. As is well known, a scan test entails forming one or more chains of corresponding memory elements, scanning a corresponding test vector to each scan chain, and evaluating the circuit portions based on the respective states of the memory elements (due to the scanning). The values stored in the memory element due to such evaluation may again be scanned out and compared with expected vectors to determine whether the circuit design operated in a desired manner.

It is generally desirable that scan tests be simulated with reduced resource requirements (e.g., reduced computational requirements, memory requirements, etc.).

SUMMARY

An aspect of the present invention replaces memory elements in a scan chain with corresponding new (memory) elements, with each new element having two paths to provide the corresponding data output. One of the two paths is operable to connect the data value to the combinational logic only during a capture phase of said test mode, and the second path is operable to connect the data value to the next element in the chain during a shift phase of said test mode.

As a result, unneeded transitions/evaluations in the combinational logic are avoided during shift time, thereby reducing the resource requirements for simulation.

However, the further design processes (including various design phases and fabrication) are continued based on the original data (i.e., without the new elements) such that unneeded delays (which would have been otherwise caused due to the additional circuitry in the new element) are avoided during the eventual operation in functional mode of the various fabricated IC units.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

Example embodiments of the present invention will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DESCRIPTION OF EXAMPLE EMBODIMENTS

Various features of the present invention are described with respect to a design flow used in designing an integrated circuit.

1. Example Design Flow

Figure 1:
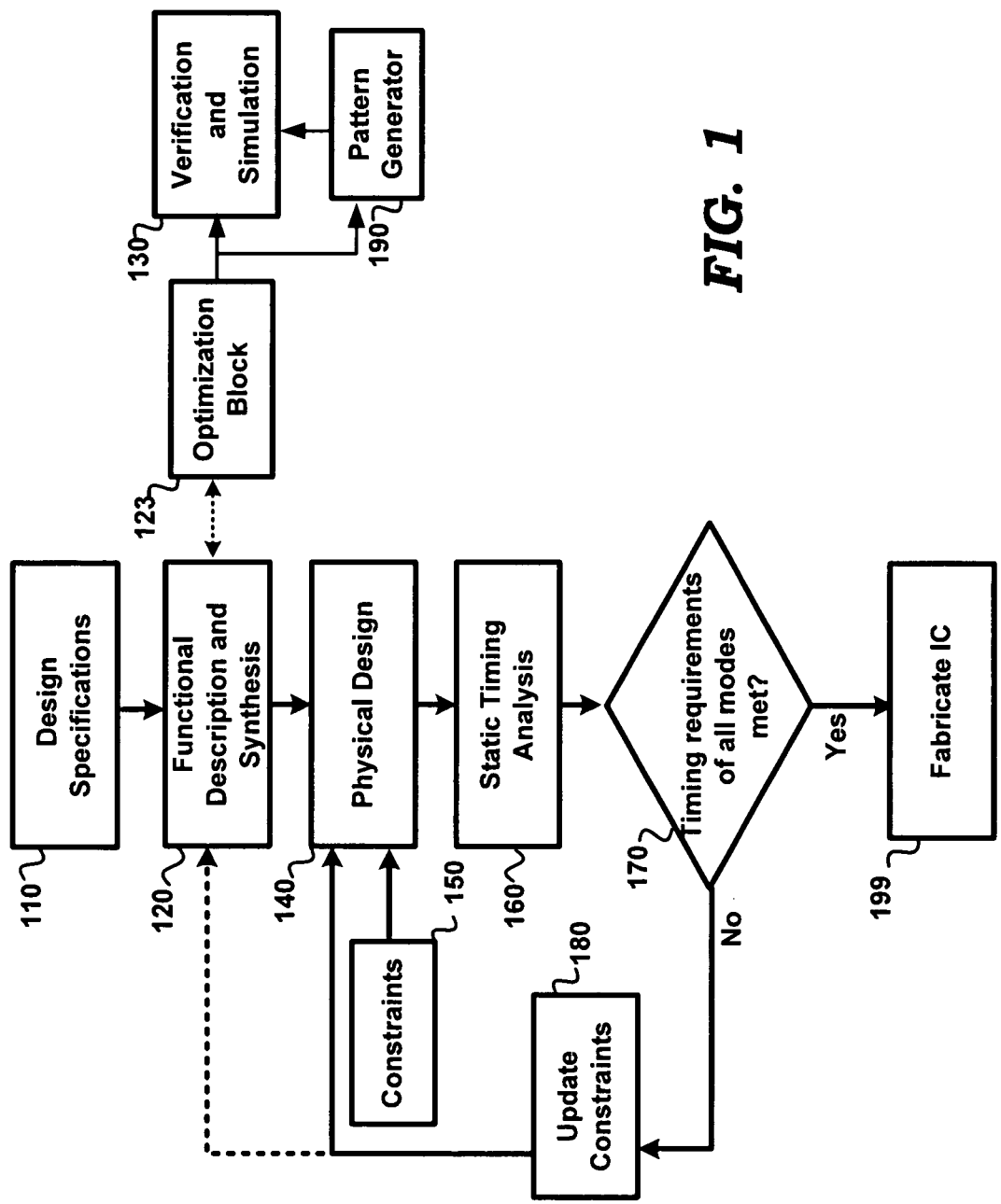
FIG. 1 is a flow diagram illustrating a typical design flow in designing an integrated circuit (IC).

FIG. 1 illustrates a typical design flow in designing an IC. The design flow is shown merely for the purpose of illustration, and may include other/alternative phases, and possibly other sequences of the phases as well. The design cycle may start with design specifications (110), in which the specifications of an integrated circuit may be generated. The specifications may be generated using various high level languages such as VHDL, well known in the relevant arts.

A functional description is followed by synthesis of the description into a circuit corresponding to the specifications (110), in step 120. Functional description and synthesis (120) may generate/form design data representing the IC at a logic level (e.g., in the form of gates, etc.). In an embodiment, the design data is represented by a netlist (specifying interconnections between the various components/blocks in the design). Netlist is a textual representation of the circuit diagram and can contain interconnections between various components from the library to represent the Boolean logic implementation of the circuit.

Various simulations are performed in step 130 to ensure that the IC design satisfies the expected behavior. Digital inputs mimicking a scenario of actual mode of operation are fed to the circuit data and response is compared with expected output. Such a mode of operation is referred to as functional mode of operation and the digital inputs are known as functional vectors/patterns.

As noted above, the IC may need to be simulated for scan tests as well. The scan tests are generally designed to detect manufacturing faults (stuck-at, transient, IDDQ, etc.) in a circuit. The scan vectors used as inputs for the scan test simulation are generated by pattern generator 190. Thus, pattern generator 190 generates functional and test vectors to test the functionality of the circuit in scan test mode. Although the verification and simulation (130) step is shown proceeding in parallel with functional design (120), it can be performed at various steps in the design flow to ensure correct functionality of the circuit.

Physical design (140) may be performed next, and generally involves placement of components in the circuit, and routing the interconnection between the components. As is well known in the relevant arts, for a circuit to operate as desired, timing requirements of various paths/nodes (through which signals such as clocks and data propagate) in the IC need to be ensured. For example, parameters of clock signals, such as duty cycle or clock period, clock skew, clock latency, etc., may need to be specified. As is also well known, physical design (140) may generate as an output the physical layout of the components in the circuit, post-placement timing of various signals in the circuit, information regarding parasitic elements in the physical layout, etc.

Static timing analysis (160) may be performed as a next step, in which the arrival times of the signals at various paths/nodes in the design are estimated, typically based on delay models (gate delays, connection-path or wire delays, etc., based on the output of the physical design step 140), as is well known in the relevant arts. The corresponding timings at the various nodes may be checked against the desired timing requirements (i.e., a comparison of arrival times against required times is made, whether set-up and hold times of clocked components/registers are acceptable, etc).

If the desired timing requirements are met, the output of the physical design process is sent for fabricating (199) the IC. If the timing requirements are not met, then physical design (140) may be performed again. The constraints may also be updated if necessary (180). In some instances, functional design (120) may be modified, if necessary, and the following steps may be repeated till the timing requirements are met. Thus, the design flow procedure noted above may be iterative. Functional design (120), physical design (140) and static timing analysis (160) may be performed by an engineer/operator using corresponding EDA tools.

Optimization block 123 provided according to an aspect of the present invention modifies the design data (generated in step 120) such that the modified data lends to reduction of resource requirements when scan tests are simulated in step 130 (based on the modified data). The advantages of the operation block will be clearer in comparison to the operation in a prior approach, and accordingly the description is provided first with respect to the prior approach.

2. Example Prior Approach

Figure 2:
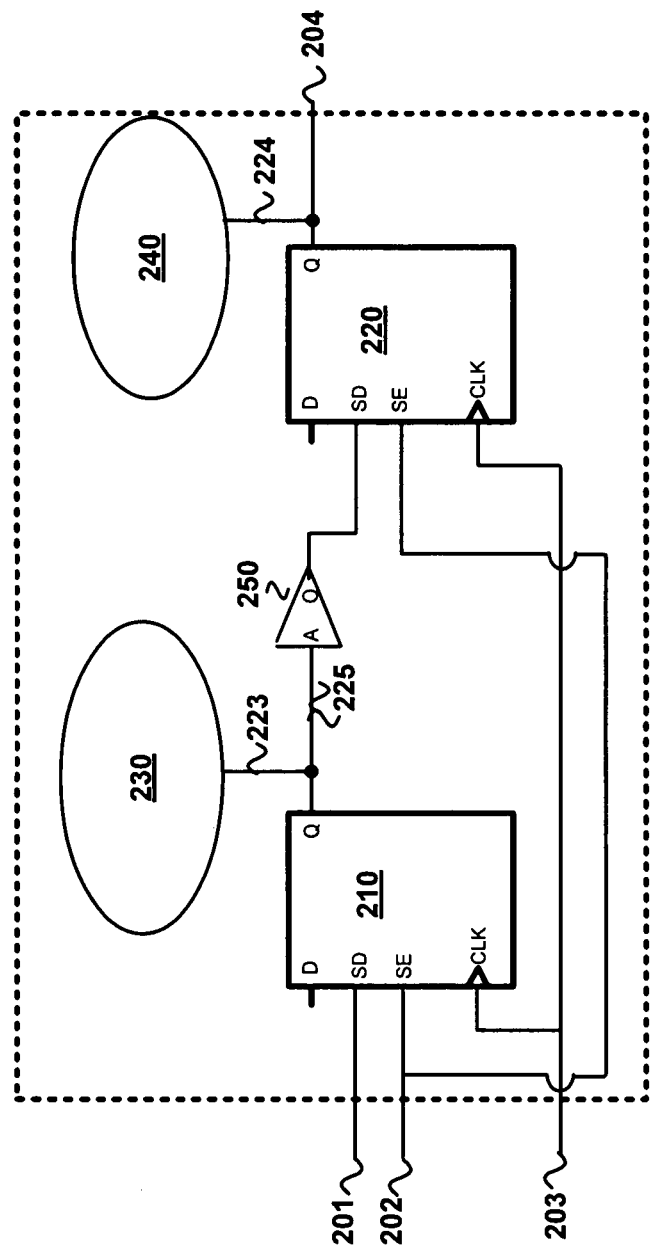
FIG. 2 is an example circuit diagram illustrating a part of a scan chain, simulated for scan tests, in a prior embodiment.

FIG. 2 is a circuit diagram illustrating an example portion of a scan chain in shift/scan phase in a prior integrated circuit designed to support scan tests. FIG. 2 is shown containing memory elements 210 and 220, combinational logics 230 and 240, and buffer 250. Each component is described below in further detail.

Each memory element 210 and 220 is shown with four input terminals D, SD, SE, CLK and one output terminal Q. Terminal D is designed to receive data in functional mode (normal post-fabricated stage) or capture phase of test mode according to the circuit design. The data may be received from a combinatorial logic or other components, according to the circuit specification.

Terminal SD is designed to receive data from a preceding memory element in the scan chain in shift phase of the test mode. Terminal SE receives logic high to indicate that the circuit is operating in scan/shift phase (i.e., input from SD to be stored), and logic low to indicate a capture phase during scan tests. Terminal CLK receives a clock signal for timing the latch operations of the memory elements. Memory elements 210 and 220 are adjacent cells in a scan chain, and are shown to receive their scan input along path 201, the clock along path 203 and scan enable along path 202.

Memory element 210 and 220 are connected via buffer 250 (for timing purpose) in shift phase of the scan test mode of operation. Memory element 210 also propagates data along path 223 to various combinational elements, which are collectively represented by combinational logic 230. Path 225 leads to buffer 250, which propagates incoming data to memory element 220 during test mode. Memory element 220 propagates data along fan-out path 224 to several combinational elements in combinational logic 240 and also provides data to the next memory element (not shown) along path 204.

In the test mode of operation, a majority of simulation time is dedicated towards shift-phase, in which individual memory elements along a scan-chain are loaded with a respective bit of a scan vector. Typically, successive bits of the scan vectors are provided from a same external pin, and shifted along the chain setup during the entire shift phase. A capture phase follows the shift phase, in which the combinatorial logics are evaluated based on the respective bit values of the scan vectors, and response of the integrated circuit is captured in to the memory elements and brought out during subsequent shift phase and compared against an expected response.

Thus, in simulation of the scan tests on an integrated circuit, a simulator (external program) shifts in the data generated by pattern generator 190 during shift phase, evaluates the circuit portions against the bits of the scan vector(s), captures the response of the design and compares it against expected data. In simulations, a change in digital value at the output of a sequential or combinational element can result, when there are one or more transitions (logical 1 to logical 0, and vice-versa) at the inputs of such elements.

Substantial (and avoidable) computational resources may be used during shift phase. In particular, it may be appreciated that though the data output of memory element 210 needs to be provided only to memory element 220, the same data output is also provided as an input to combinatorial logic 230. The simulator may evaluate all the elements (gates) of combinatorial logic 230 whenever a transition occurs in the scan chain (which is transferred on path 225).

As may be readily appreciated, such evaluations of combinatorial logic 230 may be felt as not serving a useful purpose in several environments (since the purpose of each cycle of the shift phase is typically to shift in one bit into the chain of memory elements). The magnitude of such unneeded evaluations (during simulation) increases with the circuit complexity (more elements in the combinatorial logic and/or chains).

One prior manner in which the limitations described above is by forcing each memory element to a known value thus avoiding the simulation time consumed by shifting of vectors along the scan chain. However the memory requirement for such a method tends to be huge as the hierarchal details for every scan element must be available in order to force a logical value at its output.

Several aspects of present invention overcome at least some of the limitations described above.

3. Flow Chart

Figure 3:
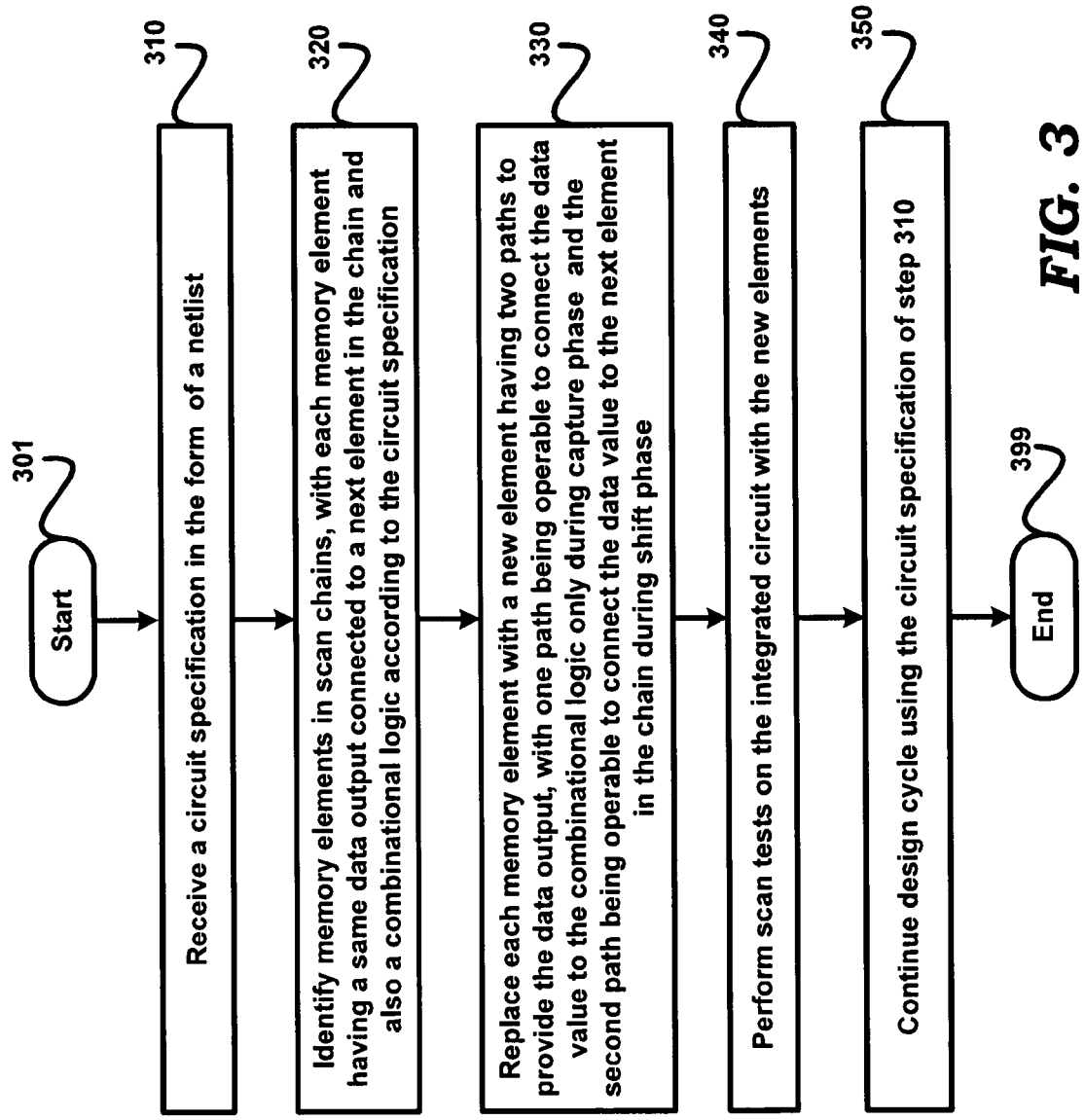
FIG. 3 is a flowchart illustrating the manner in which an IC can be designed, while reducing resources required for simulation, according to an aspect of the present invention.

FIG. 3 is a flowchart illustrating a flow for designing a circuit operable in functional and test modes in an embodiment of the present invention. The flowchart is described with respect to FIGS. 1 and 2, merely for illustration. However, various features can be implemented in other environments and other components. Alternative embodiments in other environments, using other components and different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, optimization block 123 receives a netlist containing a logic level information of the design. The information may be received from the functional description and synthesis stage (120) of the design flow. The logic level information is generally at a gate level.

In step 320, optimization block 123 identifies memory elements in various scan chains of interest. In general, the netlist may be parsed (examined) to determine the various scan chains and the memory elements within each scan chain. In an embodiment, one may start with the pins (in an IC) that are used for either scan-in or scan-out, and the chains may be identified by sequentially traversing each component coupled to such pin. The parsing/identification may be performed in a known way, potentially using various utilities provided by the design automation tools in corresponding environments.

It should be appreciated that each memory element (of the netlist) thus identified would have a same data output connected to a next element in the chain and also a combinational logic according to the circuit specification (for example, as demonstrated above with respect to paths 223 and 225 of FIG. 2).

In step 330, optimization block 123 replaces each identified memory element with a corresponding new (memory) element. Each new element has two paths to provide the data output, with one path being operable to connect the data value to the combinational logic only during capture phase and the second path being operable to connect the data value to the next element in the chain during shift phase.

In other words, the single data out path of the memory element in the netlist is replaced with two paths, which each path being operable in corresponding one of the shift phase and the capture phase. As will be explained later, the first path of the new memory element propagates the data output (of the memory element) to the next new element in the scan chain and the second path propagates the data output to the combinatorial logic during capture phase. A new netlist is formed due to such replacements.

In step 340, scan tests are performed on the integrated circuit with the new elements in place of the originals elements of step 310. As will be described in sections below, the use of new elements reduces many of the computations performed in the combinational logics during simulation in the prior embodiment noted above with respect to FIG. 2.

In step 350, the design cycle continues with the original (unmodified) netlist of step 310. For example, with respect to FIG. 1, the physical design, static timing and fabrication phases may be continued using the original netlist. The flowchart ends in step 399.

It should be appreciated that the simulation technique (with replaced memory elements) described above can be used after other phases (not just after 120, as described above).

It should be further appreciated that the integrated circuit is fabricated using the information in the original netlist. As a result, any delays type inefficiencies that would be otherwise introduced in the fabricated IC, if the replacement elements were used, would be avoided.

The manner in which the features described in step 330 are obtained in an embodiment of the present invention is described in detail in sections below with illustrative examples.

4. Novel Memory Element

Figure 4A:
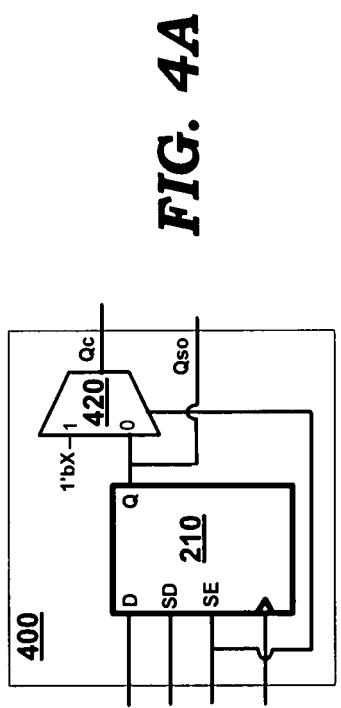
FIG. 4A is a circuit diagram illustrating the structure of a new memory element used during simulation in an embodiment of the present invention.

FIG. 4A is a circuit diagram illustrating an example new memory element provided according to an aspect of present invention. For ease of understanding, the manner in which the element of FIG. 2 can be modified to create the new memory element, is described. New memory element 400 is shown containing memory element 210 and multiplexor (MUX) 420.

New memory element 400 is shown receiving 4 inputs D, SD, SE, CLK, and providing two outputs Qc and Qso. D, SD, SE and CLK signals are similar to those described above with respect to FIG. 2, and the description is not repeated in the interest of conciseness.

SE (402/202) is used as a select line for multiplexor 420 to provide the first output (Qc) of new memory element. As may be readily observed, when SE is high (i.e., in shift phase), a constant value (either 1 or 0) is provided on path Qc for all the cycles. As a result, transitions are avoided on path Qc during successive cycles of shift phase. On the other hand, path Qso provides the data output, similar to path 225 of FIG. 2.

While FIG. 4A depicts an example structure for the new element, various alternative embodiments of such memory elements will be apparent to one skilled in the relevant arts by reading the disclosure provided herein. Such alternative embodiments are contemplated to be within the scope and spirit of various aspects of the present invention. The embodiments thus provided can be used in various integrated circuits. For illustration, the manner in which the circuit of FIG. 2 can be modified using the circuit of FIG. 4A, is described below.

5. Circuit Requiring Reduced Resources for Simulation

Figure 4B:
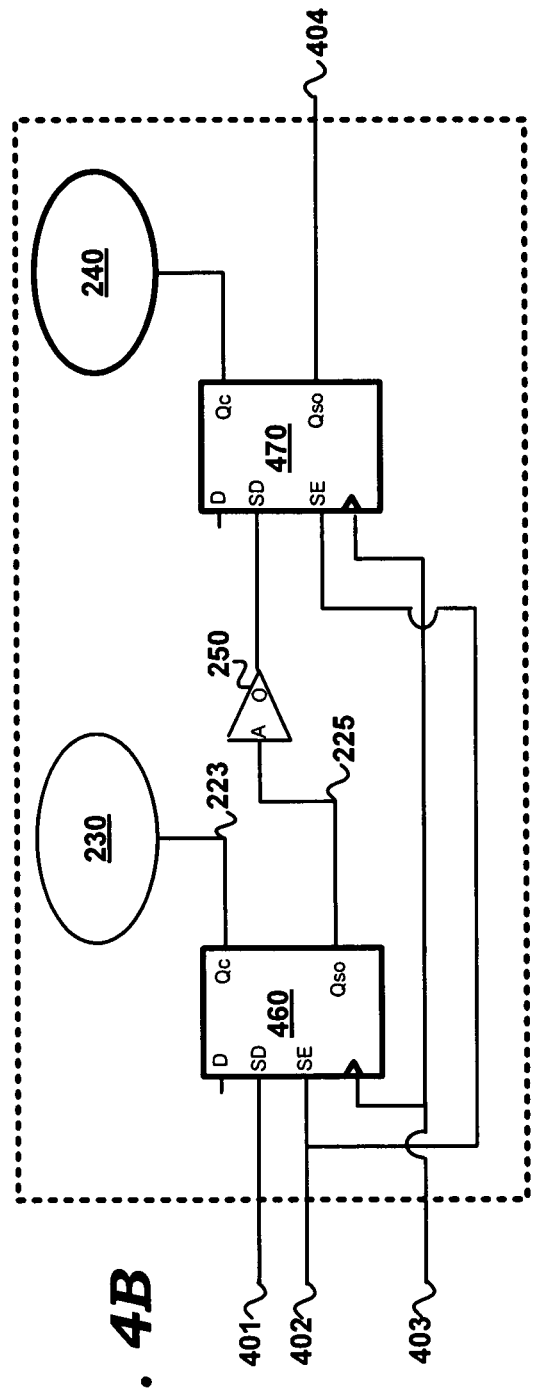
FIG. 4B is an example circuit diagram used to illustrate the operation of a modified design of an integrated circuit in an embodiment of the present invention.

FIG. 4B is a circuit diagram illustrating the nature of a circuit suitable for simulation formed according to an aspect of the present invention. In particular, FIG. 4B illustrates the manner in which example portion of a scan chain in shift phase of FIG. 2 circuit can be modified using scan cells designed according to FIG. 4A.

For conciseness, the same circuit elements of FIG. 2 are repeated in FIG. 4B, except that memory elements 210 and 220 are respectively replaced by new memory elements 460 and 470 (implemented according to the approached described with respect to FIG. 3). The common elements are not described again, and the differences are described in further detail below.

As can be readily observed, the Qc output of scan cell 460 is connected as the input to path 223 which electrically couples to various combinational elements in combinational logic 230. Qso of scan cell 460 is shown connected to buffer 250 which propagates the logical value at its input to the scan input (SD) (on path 225) of new memory element 470, similar to as in the circuit of FIG. 2.

Thus, during the shift phase (in which SE=1), during each clock cycle of clock 403, the fixed value (0 or 1) would be propagated on path 223. Since the same value is being propagated every cycle of the shift phase, there are no transitions on path 223, thereby avoiding unneeded computations for simulations during shift phase.

On the other hand, during capture phase (SE=0), the Q output is passed on path 223 as an input to combinational logic 230, as required for the evaluation of the logic in combinational block 230.

During both the capture and shift phases, the Q data output is shown being passed to memory element 470. Though not shown, as is well known in the relevant arts, memory element 210/460 would have sufficient logic to store the SD inputs only during the shift phase of the scan tests. The data received on D input is stored during the capture phase and during the functional mode of operation. For example, combinatorial logic 230 may provide the D input for memory elements 220/470.

Thus, according to the approach described above, computational requirements are reduced when simulating scan tests on ICs. The operation of optimization block 123 in one embodiment is described below in further detail.

6. Implementation Details

In one embodiment, a separate library is first created for the new cells. Assuming the original cells are part of an original library, a new library is created for each memory element type (e.g., each type differing by variables such as drive strength, the reset signal polarity, clock polarity, etc.), using similar logic as in FIG. 4A. Thus, if the integrated circuit is designed using 10 types of memory elements, the new library may also contain 10 replacement element types.

Various tracer type tools (available in the market place) are used to identify the scan chains as well as the elements in each chain. Information is maintained in appropriate data structures (e.g., a hash table) to indicate the fanout (i.e., the other elements to which output path is being connected to) for each memory element.

Thereafter, for each memory element thus identified, a type of the memory element is determined. From the new library, the corresponding new memory element (type) is located. The original memory element is then replaced by the new memory element (from the second library), while ensuring the connections are provided consistent with the logic described above. The replacement generally depends on the manner in which the connectivity information is represented (e.g., in the netlist) and the implementation of replacement will be apparent to one skilled in the relevant arts.

The resulting new design is represented in the form of a new netlist. The new netlist (e.g., along the lines of FIG. 4B) is thereafter used for simulation.

It should be appreciated that the circuit design of FIG. 2 may be used again for later design phases such that the delays that would otherwise be introduced by components such as multiplexor 420 are avoided in the eventual fabricated ICs.

The features described above can be implemented in various combinations of hardware, software and firmware. The description is continued with respect to an embodiment in which the features are operative upon execution of appropriate software instructions.

7. Digital Processing System

Figure 5:
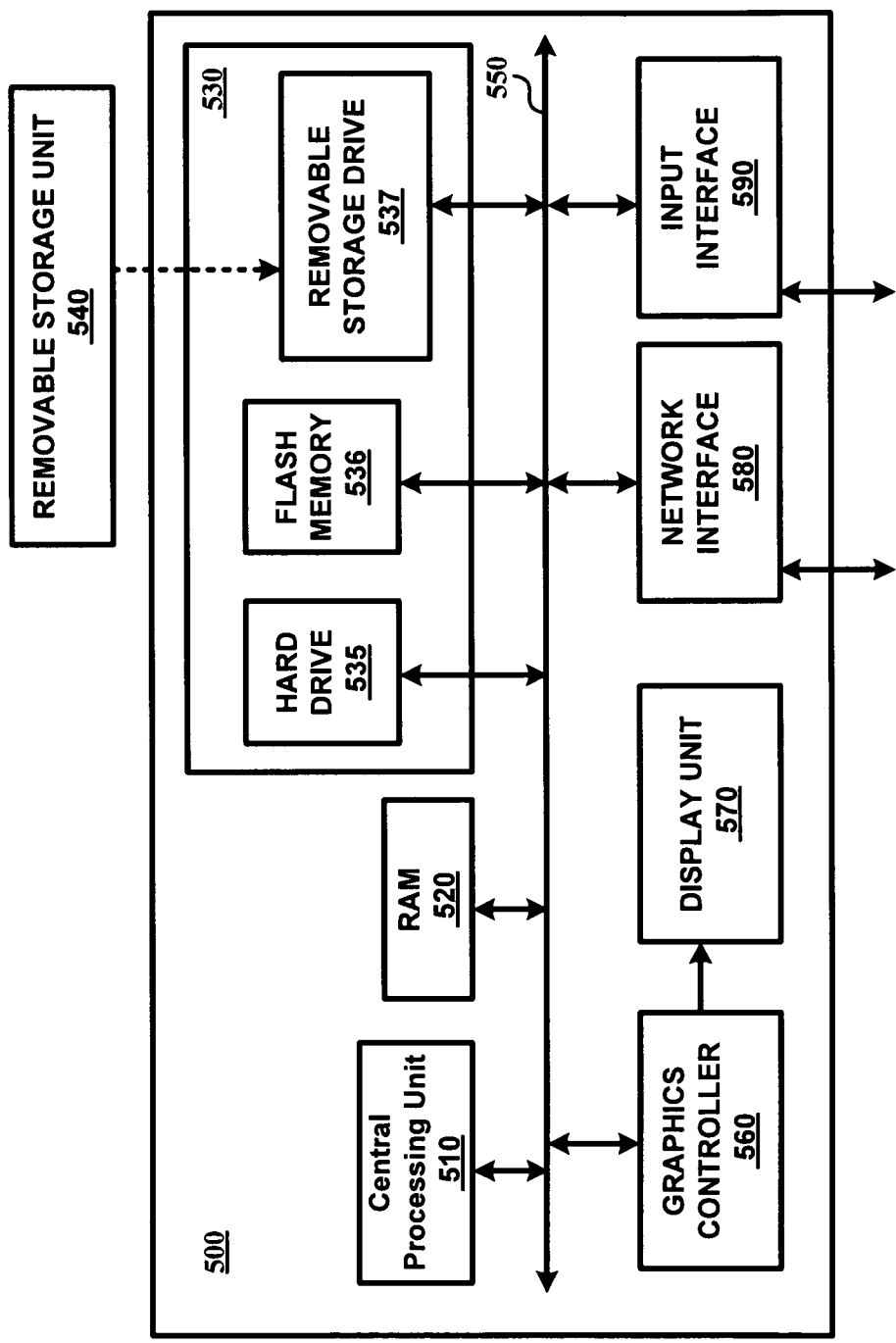
FIG. 5 is a block diagram illustrating the details of an embodiment of a system in which several aspects of the present invention are operative upon execution of appropriate software instructions according to an aspect of the present invention.

FIG. 5 is a block diagram illustrating the details of a digital processing system in which various aspects of the present invention are operative by execution of appropriate software instructions. Digital processing system 500 may be used to implement optimization block 123 described above. Digital processing system 500 can also be used to implement the other design phases (except fabrication).

Digital processing system 500 may contain one or more processors such as a central processing unit (CPU) 510, random access memory (RAM) 520, secondary memory 530, output interface 560, network interface 580 and input interface 590. All the components may communicate with each other over communication path 550, which may contain several buses as is well known in the relevant arts.

CPU 510 may execute instructions stored in RAM 520 to provide several features of the present invention. CPU 510 may contain multiple processing units, with each processing unit potentially being designed for a specific task. Alternatively, CPU 510 may contain only a single general-purpose processing unit. RAM 520 may receive instructions from secondary memory 530 using communication path 550.

Input interface 590 may correspond to a keyboard and a pointing device (e.g., touch-pad, mouse) and may be used to provide inputs (e.g., user input during various phases of FIG. 1). Network interface 580 provides connectivity to a network, and may be used to communicate with other connected systems (not shown).

Secondary memory 530 may contain hard drive 535, flash memory 536, and removable storage drive 537. Secondary memory 530 may store the data (e.g., Netlists, libraries, etc., described above) and software instructions, which enable digital processing system 500 to provide several features in accordance with the present invention.

Some or all of the data and instructions may be provided on removable storage unit 540, and the data and instructions may be read and provided by removable storage drive 536 to CPU 510. Floppy drive, magnetic tape drive, CD-ROM drive, DVD Drive, Flash memory, removable memory chip (PCMCIA Card, EPROM) are examples of such removable storage drive 537.

Removable storage unit 540 may be implemented using medium and storage format compatible with removable storage drive 537 such that removable storage drive 537 can read the data and instructions. Thus, removable storage unit 540 includes a computer readable (storage) medium having stored therein computer software and/or data. However, the computer (or machine, in general) readable medium can be in other forms (e.g., non-removable, or removable, etc.).

In this document, the term "computer program product" is used to generally refer to removable storage unit 540 or hard disk installed in hard drive 535. These computer program products are means for providing software to digital processing system 500. CPU 510 may retrieve the software instructions, and execute the instructions to provide various features of the present invention described above.

Reference throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

It should be understood that the figures and/or screen shots illustrated in the attachments highlighting the functionality and advantages of the present invention are presented for example purposes only. The present invention is sufficiently flexible and configurable, such that it may be utilized in ways other than that shown in the accompanying figures.

Further, the purpose of the following Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A method of designing an integrated circuit (IC), said method comprising:

forming a design data representing said IC at a logic level, said integrated circuit containing a plurality of memory elements and a plurality of combination logics which together provide an intended utility of said IC in a functional mode, said plurality of memory elements further being configurable to form a set of scan chains in a test mode;

identifying a set of memory elements which are present in said set of scan chains, wherein each of said set of memory elements has a same data output connected to a next element in a corresponding scan chain and also a corresponding combinational logic according to said design data;

replacing each of said set of memory elements with a corresponding one of a set of a new elements, wherein a single data output path of at least one memory element is replaced with two paths, with each path being operable in a corresponding one of a shift phase and a capture phase, wherein each new element has two paths to provide the corresponding data output, with one path being operable to connect the data value to the combinational logic only during a capture phase of said test mode, and the second path being operable to connect the data value to the next element in the chain during a shift phase of said test mode; and simulating a plurality of scan tests on said IC with said set of new elements using a processor.

2. The method of claim 1, further comprising:

continuing a set of design phases for said IC using said design data with said set of memory elements after completion of said simulating.

3. The method of claim 2, wherein said set of design phases comprises a physical design phase and a static timing analysis phase.

4. The method of claim 1, wherein said one path is coupled to said corresponding combinational logic during both of said capture phase and said shift phase, said one path being designed to provide a same value in each of a sequence of cycles in said shift phase and to provide the data value in said capture phase.

5. The method of claim 4, wherein each of said set of new elements comprises:

the corresponding memory element providing said data value on an internal path, which is also coupled as said one path of said new element; and a multiplexor to receive said internal path on a first input and said same value on a second input, said multiplexor to select said first input in said capture phase and said second input in said shift phase, the selected value being provide on said second path of the new element.

6. The method of claim 1, further comprising:

maintaining a first library of a plurality of types of memory elements and a second library, where each of said plurality of memory elements is one of said plurality of types and said second library contains a corresponding new element type for each of said plurality of types of memory elements; and locating the corresponding new element type in said second library for each of said plurality of memory elements based on the type of the memory element, wherein the located new element type is used as the corresponding one of said new element by said replacing.

7. A non-transitory machine readable medium storing one or more sequences of instructions for causing a system to facilitate the design of an integrate circuit, wherein execution of said one or more sequences of instructions by one or more processors contained in said system causes said system to perform the actions of:

receiving a design data representing said IC at a logic level, said integrated circuit containing a plurality of memory elements and a plurality of combination logics which together provide an intended utility of said IC in a functional mode, said plurality of memory elements further being configurable to form a set of scan chains in a test mode;

identifying a set of memory elements which are present in said set of scan chains, wherein each of said set of memory elements has a same data output connected to a next element in a corresponding scan chain and also a corresponding combinational logic according to said design data;

replacing each of said set of memory elements with a corresponding one of a set of a new elements, wherein a single data output path of at least one memory element is replaced with two paths, with each path being operable in a corresponding one of a shift phase and a capture phase, wherein each new element has two paths to provide the corresponding data output, with one path being operable to connect the data value to the combinational logic only during a capture phase of said test mode, and the second path being operable to connect the data value to the next element in the chain during a shift phase of said test mode; and simulating a plurality of scan tests on said IC with said set of new elements.

8. The machine readable medium of claim 7, further comprising:

maintaining a first library of a plurality of types of memory elements and a second library, where each of said plurality of memory elements is one of said plurality of types and said second library contains a corresponding new element type for each of said plurality of types of memory elements; and locating the corresponding new element type in said second library for each of said plurality of memory elements based on the type of the memory element, wherein the located new element type is used as the corresponding one of said new element by said replacing.

9. The machine readable medium of claim 8, further comprising:

continuing a set of design phases for said IC using said design data with said set of memory elements after completion of said simulating.

10. The machine readable medium of claim 9, wherein said set of design phases comprises a physical design phase and a static timing analysis phase.

11. The machine readable medium of claim 9, wherein said one path is coupled to said corresponding combinational logic during both of said capture phase and said shift phase, said one path being designed to provide a same value in each of a sequence of cycles in said shift phase and to provide the data value in said capture phase.

12. The machine readable medium of claim 9, wherein each of said set of new elements comprises:

the corresponding memory element providing said data value on an internal path, which is also coupled as said one path of said new element; and a multiplexor to receive said internal path on a first input and said same value on a second input, said multiplexor to select said first input in said capture phase and said second input in said shift phase, the selected value being provide on said second path of the new element.

13. A digital processing system comprising:

a memory to store a first library and a second library, said first library containing a plurality of types of memory elements and said second library containing a new element for each of said plurality of types of memory elements, wherein each of said set of plurality of types of memory elements has a single data output, wherein a single data output path of at least one memory element is replaced with two paths, with each path being operable in a corresponding one of a shift phase and a capture phase, wherein each new element has two paths to provide the corresponding data output, with one path being operable to connect the data value only during a capture phase of a test mode, and the second path being operable to connect the data value during a shift phase of said test mode; and a processor operable to:
receive a design data representing said IC at a logic level, said integrated circuit containing a plurality of memory elements and a plurality of combination logics which together provide an intended utility of said IC in a functional mode, said plurality of memory elements further being configurable to form a set of scan chains in said test mode;
identify a set of memory elements which are present in said set of scan chains, each of said set of memory elements being one of said plurality of types;
replace each of said set of memory elements with a corresponding said new element, wherein the first path of the memory element is connected to a corresponding combination logic and the second path of the memory element being connected to a next memory element of the corresponding scan chain; and
simulate a plurality of scan tests on said IC with said set of new elements.

14. The digital processing system of claim 13, wherein said processor is further operable to:
continue a set of design phases for said IC using said design data with said set of memory elements after completion of said simulating.

15. The digital processing system of claim 14, wherein said set of design phases comprises a physical design phase and a static timing analysis phase.

16. The digital processing system of claim 13, wherein each of said set of new elements comprises:
the corresponding memory element providing said data value on an internal path, which is also coupled as said one path of said new element; and
a multiplexor to receive said internal path on a first input and said same value on a second input, said multiplexor to select said first input in said capture phase and said second input in said shift phase, the selected value being provide on said second path of the new element.

17. The method of claim 1, further comprising:
replacing each of said set of memory elements from a first library with a corresponding one of a set of a new elements from at least a second distinct library, said distinct library different from the first library.

* * * * *